(12) United States Patent
Byun et al.

(10) Patent No.: US 7,755,958 B2
(45) Date of Patent: Jul. 13, 2010

(54) SEMICONDUCTOR MEMORY DEVICE AND METHOD THEREOF

(75) Inventors: Young-yong Byun, Seoul (KR); Hi-choon Lee, Yongin-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 530 days.

(21) Appl. No.: 11/878,087

(22) Filed: Jul. 20, 2007

(65) Prior Publication Data
US 2008/0089153 A1 Apr. 17, 2008

(30) Foreign Application Priority Data
Oct. 16, 2006 (KR) .................. 10-2006-0100383

(51) Int. Cl.
*G11C 29/00* (2006.01)
(52) U.S. Cl. .............. 365/201; 365/200; 365/185.05; 365/185.09; 365/189.07; 365/185.02; 714/718; 714/719; 714/724
(58) Field of Classification Search .......... 365/200, 365/201, 185.05, 185.09, 189.07, 185.02, 365/225.7; 714/718, 719, 724
See application file for complete search history.

(56) References Cited

U.S. PATENT DOCUMENTS

| | | | | |
|---|---|---|---|---|
| 5,930,184 | A * | 7/1999 | Waller | 365/201 |
| 2002/0008509 | A1 * | 1/2002 | Kang | 324/200 |
| 2004/0151039 | A1 * | 8/2004 | Lee et al. | 365/200 |
| 2004/0252549 | A1 * | 12/2004 | Kim et al. | 365/154 |
| 2006/0002204 | A1 | 1/2006 | Nam et al. | |
| 2007/0283198 | A1 * | 12/2007 | Lee | 714/724 |

FOREIGN PATENT DOCUMENTS

| | | |
|---|---|---|
| JP | 2002-208294 | 7/2002 |
| KR | 10-1995-0001293 | 2/1995 |
| KR | 2003-0007159 | 1/2003 |
| KR | 10 2006/0002502 | 1/2006 |
| KR | 10 2006/0022362 | 3/2006 |

OTHER PUBLICATIONS

Office Action dated Mar. 14, 2008 for corresponding Korean Application No. 10-2006-0100383.

* cited by examiner

*Primary Examiner*—Pho M. Luu
*Assistant Examiner*—Eric Wendler
(74) *Attorney, Agent, or Firm*—Harness, Dickey & Pierce, P.L.C.

(57) ABSTRACT

A semiconductor memory device and method thereof are provided. The example semiconductor memory device may include a plurality of comparators receiving output data signals from each of a plurality of sub-array blocks, comparing the output data signals from each of the plurality of sub-array blocks and outputting a plurality of comparison result signals and a test circuit receiving the plurality of comparison result signals from the plurality of comparators, respectively, the test circuit configured to selectively output one of a given one of the plurality of comparison result signals on a given data input/output pad and a given signal obtained by performing a logical operation on at least two of the plurality of comparison result signals on the given data input/output pad in response to a select signal.

21 Claims, 6 Drawing Sheets

| D00 | D10 | D20 | D30 | CP_0 |
|---|---|---|---|---|
| 0 | 0 | 0 | 0 | 0 |
| 0 | 1 | 0 | 0 | 1 |
| 1 | 0 | 1 | 0 | 1 |
| 1 | 1 | 0 | 1 | 1 |

FIG. 3B

| D00 | D10 | D20 | D30 | CP_0 |
|---|---|---|---|---|
| 0 | 0 | 0 | 0 | 1 |
| 0 | 1 | 0 | 0 | 0 |
| 1 | 0 | 1 | 0 | 0 |
| 1 | 1 | 0 | 1 | 0 |

SEMICONDUCTOR MEMORY DEVICE AND METHOD THEREOF

PRIORITY STATEMENT

The application claims the benefit of Korean Patent Application No. 10-2006-0100383, filed on Oct. 16, 2006, in the Korean Intellectual Property Office, the disclosure of which is incorporated herein in its entirety by reference.

BACKGROUND OF THE INVENTION

1. Field of the Invention

Example embodiments of the present invention relate to generally to a semiconductor memory device and method thereof.

2. Description of the Related Art

A manufacturing process for a conventional semiconductor memory device, such as a dynamic random access memory (DRAM), may include several processes, such as designing, processing, chip testing and package testing. In the chip testing process, the semiconductor memory device may be tested. For example, during a parallel bit test (PBT) process, data may be written to a cell and the written data may be read to determine if the cell is defective based on a comparison between the read data and the written data. In the PBT process, data on a data line in the read operation may be merged for testing. The testing may typically be performed in units of one cell or one bit line to determine whether the data on that particular bit line is normal. The testing phase of the manufacturing process is typically a time-consuming and costly process. To reduce costs associated with the testing phase, data in a plurality of cells and/or on a plurality of bit lines may be logically combined using comparators and the resulting signal may be used for testing (e.g., to determine relatively quickly whether any of the plurality of cells/bit lines includes an error).

For example, if data is output in units of 4 bits, 4-bit data signals may be input to the comparator. The comparator may compare the input signals to determine whether each input signal is the same. Thus, the same data may be written to each cell to determine whether one or more of the cells are defective based on an output signal of the comparator.

In the conventional PBT process, the output signals of the comparators may each be output via a data input/output pad DQ for each comparator. Accordingly, the output signals of the comparators may be output to respective data input/output pads DQ via data lines. If a given cell is determined to be defective, a block including the defective cell may be replaced or "repaired" with a redundancy cell block. That is, the block including the defective cell may be replaced with the redundancy cell block. The redundancy cell block may hold address information of the block including the defective cell as its fuse is cut.

In the conventional PBT process, the output signals of the comparators may be used for testing the output signals one by one (e.g., because each comparator outputs its results on a separate data input/output pad DQ). The conventional PBT process may be a relatively time consuming and expensive process.

SUMMARY OF THE INVENTION

An example embodiment of the present invention is directed to a semiconductor memory device, including a plurality of comparators receiving output data signals from each of a plurality of sub-array blocks, comparing the output data signals from each of the plurality of sub-array blocks and outputting a plurality of comparison result signals and a test circuit receiving the plurality of comparison result signals from the plurality of comparators, respectively, the test circuit configured to selectively output one of a given one of the plurality of comparison result signals on a given data input/output pad and a given signal obtained by performing a logical operation on at least two of the plurality of comparison result signals on the given data input/output pad in response to a select signal.

Another example embodiment of the present invention is directed to a method of performing a parallel bit test with a semiconductor memory device, including receiving a plurality of output data signals from a plurality of sub-array blocks, respectively, comparing the output data signals from each of the plurality of sub-array blocks to generate a plurality of comparison result signals and selectively outputting one of a given one of the plurality of comparison result signals on a given data input/output pad and a given signal on the given data input/output pad in response to a select signal, the given signal generated by performing a logical operation on at least two of the plurality of comparison result signals.

Another example embodiment of the present invention is directed to a semiconductor memory device that improves an efficiency of a parallel bit test (PBT) and may reduce the number of fuses to be cut during a repair operation.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
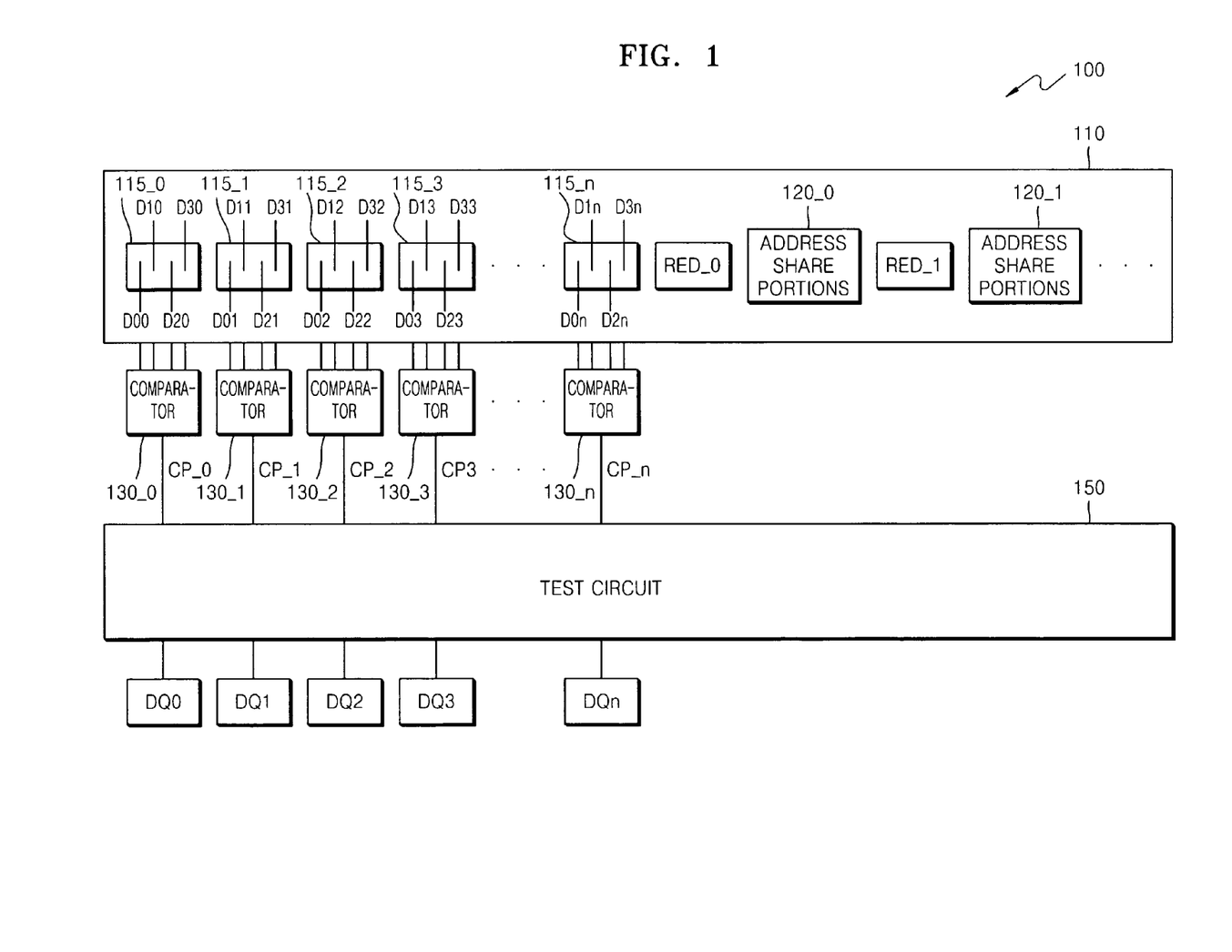
FIG. 1 is a block diagram illustrating a semiconductor memory device according to an example embodiment of the present invention.

FIG. 1 is a block diagram illustrating a semiconductor memory device 100 according to an example embodiment of the present invention.

In the example embodiment of FIG. 1, the semiconductor memory device 100 may include a memory cell array 110, at least one comparator 130_0 through 130_$n$ and a test circuit 150. The memory cell array 110 may include a plurality of sub-array blocks 115_0 through 115_$n$ and a plurality of redundancy cell blocks RED_0 through RED_N.

In the example embodiment of FIG. 1, data may be output in units of 4 bits. However, it is understood that the 4-bit configuration is given for example purposes only, and other example embodiments of the present invention may be configured to output data in units of any bit length (e.g., 2 bits, 8 bits, etc.). In an example, the sub-array block 115_0 of the memory cell array 110 may output 4-bit data signals D00, D10, D20 and D30. Because each of the sub-array blocks 115_0 through 115_$n$ outputs 4-bit data signals, each of the redundancy cell blocks RED_0 through RED_N repairing the sub-array blocks 115_0 through 115_$n$ may output 4-bit data signals.

In the example embodiment of FIG. 1, the memory cell array 110 may further include address share portions 120_0 through 120_N, each of which may be positioned between two of the redundancy cell blocks RED_0 through RED_N. Example structure of the address share portion 120_0 through 120_N will be described later with reference to FIG. 6.

In the example embodiment of FIG. 1, the comparators 130_0 through 130_$n$ may compare output data of the sub-array blocks 115_0 through 115_$n$ and output an output signal. Because each of the sub-array blocks 115_0 through 115_$n$ outputs 4-bit data signals, each of the comparators 130_0 through 130_$n$ may receive and compare the 4-bit data signals of each of the sub-array blocks 115_0 through 115_$n$. Example structure of each of the comparators 130_0, through 130_$n$ will be described later with reference to FIGS. 2A and 2B.

In the example embodiment of FIG. 1, the test circuit 150 of the semiconductor memory device 100 may receive output signals CP_0 through CP_n of the comparators 130_0 through 130_$n$ and may perform a test to determine whether a defect is present within one or more of the sub-array blocks 115_0 through 115_$n$ based on output signals of the test circuit 150 on data input/output pads DQ0, DQ1, . . . , DQn. Example structure of the test circuit 150 will be described later with reference to FIGS. 3A and 3B.

Figure 2A:
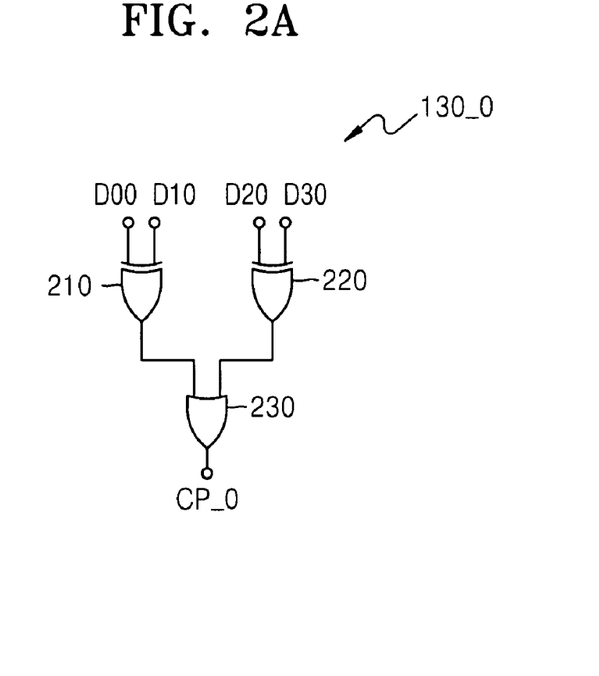
FIG. 2A is a circuit diagram illustrating a comparator of the semiconductor memory device of FIG. 1 according to an example embodiment of the present invention.

FIG. 2A is a circuit diagram illustrating the comparator 130_0 of the semiconductor memory device 100 of FIG. 1 according to an example embodiment of the present invention.

Figure 2B:
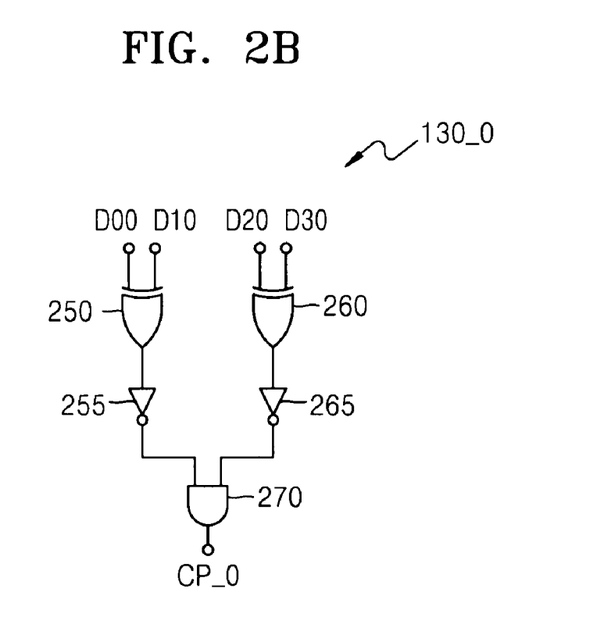
FIG. 2B is a circuit diagram illustrating the comparator of the semiconductor memory device of FIG. 1 according to another example embodiment of the present invention.

FIG. 2B is a circuit diagram illustrating the comparator 130_0 of the semiconductor memory device 100 of FIG. 1 according to another example embodiment of the present invention.

Figure 3A:
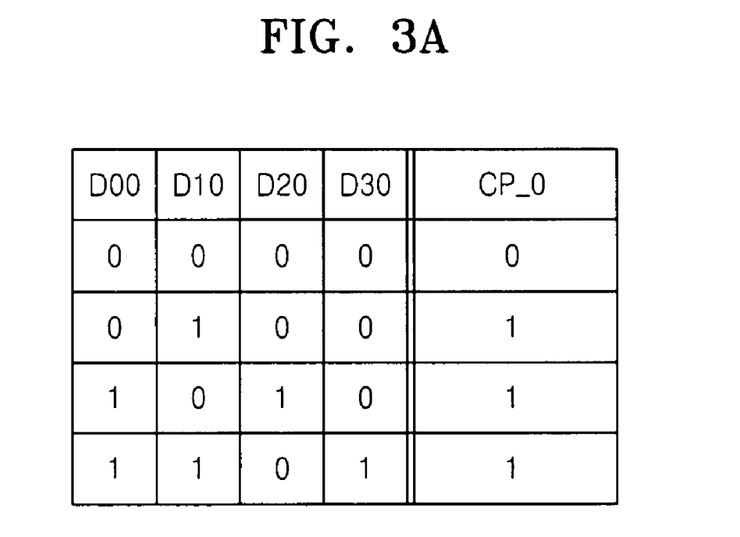
FIG. 3A illustrates a logic table of the comparator as configured in FIG. 2A according to an example embodiment of the present invention.

FIG. 3A illustrates a logic table of the comparator 130_0 as configured in FIG. 2A according to an example embodiment of the present invention.

Figure 3B:
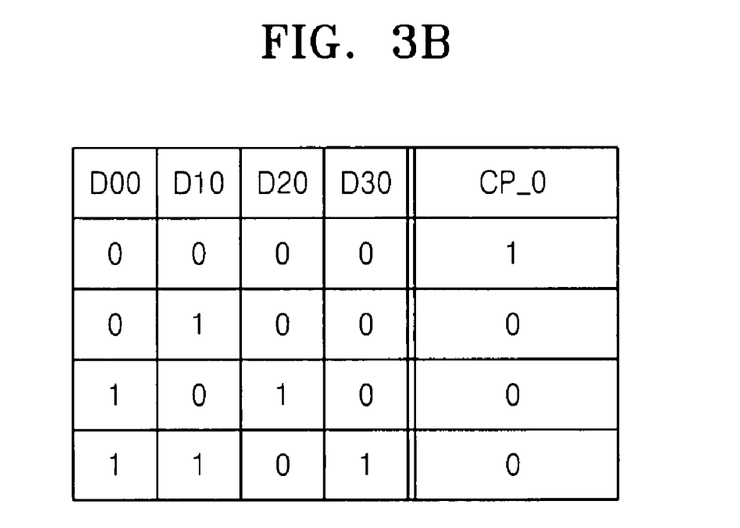
FIG. 3B illustrates a logic table of the comparator as configured in FIG. 2B according to another example embodiment of the present invention.

FIG. 3B illustrates a logic table of the comparator 130_0 as configured in FIG. 2B according to an example embodiment of the present invention.

In the example embodiments of FIGS. 2A and 2B, the comparator 130_0 may be embodied as a comparing logic circuit including a plurality of stages of exclusive OR (XOR) gates and other gates to perform a parallel bit test (PBT). The comparator 130_0 may output an output signal in a first logic state (e.g., a lower logic level or logic "0") if each of input data D00, D10, D20 and D30 are in the same logic state and in a second logic state (e.g., a higher logic level or logic "1") if one or more of the input signals D00, D10, D20 and D30 from among the input signals D00, D10, D20 and D30 are in different states.

In the example embodiment of FIG. 2A and FIG. 3A, the comparator 130_0 may include two XOR gates 210 and 220, and one OR gate 230. If one or more of the input data signals D00 and D10 input to the XOR gate 210 and data D20 and D30 input to the XOR gate 220 are set to different logic states from among the input data signals D00, D10, D20 and D30, one or more of the inputs of the OR gate 230 may transition to the second logic state. Accordingly, if each of the input data signals D00, D10, D20 and D30 input to the XOR gate 210 and the XOR gate 220 are in the same logic state, the output signal CP_0 of the comparator 130_0 may be transition to the first logic state. If one or more of the input data signals D00, D10, D20 and D30 to the XOR gate 210 and the XOR gate 220 is in a different logic state from among the input data signals D00, D10, D20 and D30, the output signal CP_0 of the comparator 130_0 may transition to the second logic state.

In the example embodiment of FIG. 2B and FIG. 3B, the comparator 130_0 may include two XOR gates 250 and 260, two inverters 255 and 265, and one AND gate 270. If one or more of the data signals D00 and D10 input to the XOR gate 250 and data signals D20 and D30 input to the XOR gate 260 is in a different logic state from among the input data signals D00, D10, D20 and D30, one or more of the inputs of the AND gate 270 may be set to the first logic state or second logic state. Accordingly, if each of the input data signals D00, D10, D20 and D30 are in the same logic state, the output signal CP_0 of comparator 130_0 may transition to the second logic state. If one or more of the input data D00, D10, D20 and D30 is in a different logic state from among the input data signals D00, D10, D20 and D30, the output signal CP_0 of the comparator 130_0 may transition to the first logic state.

Figure 4:
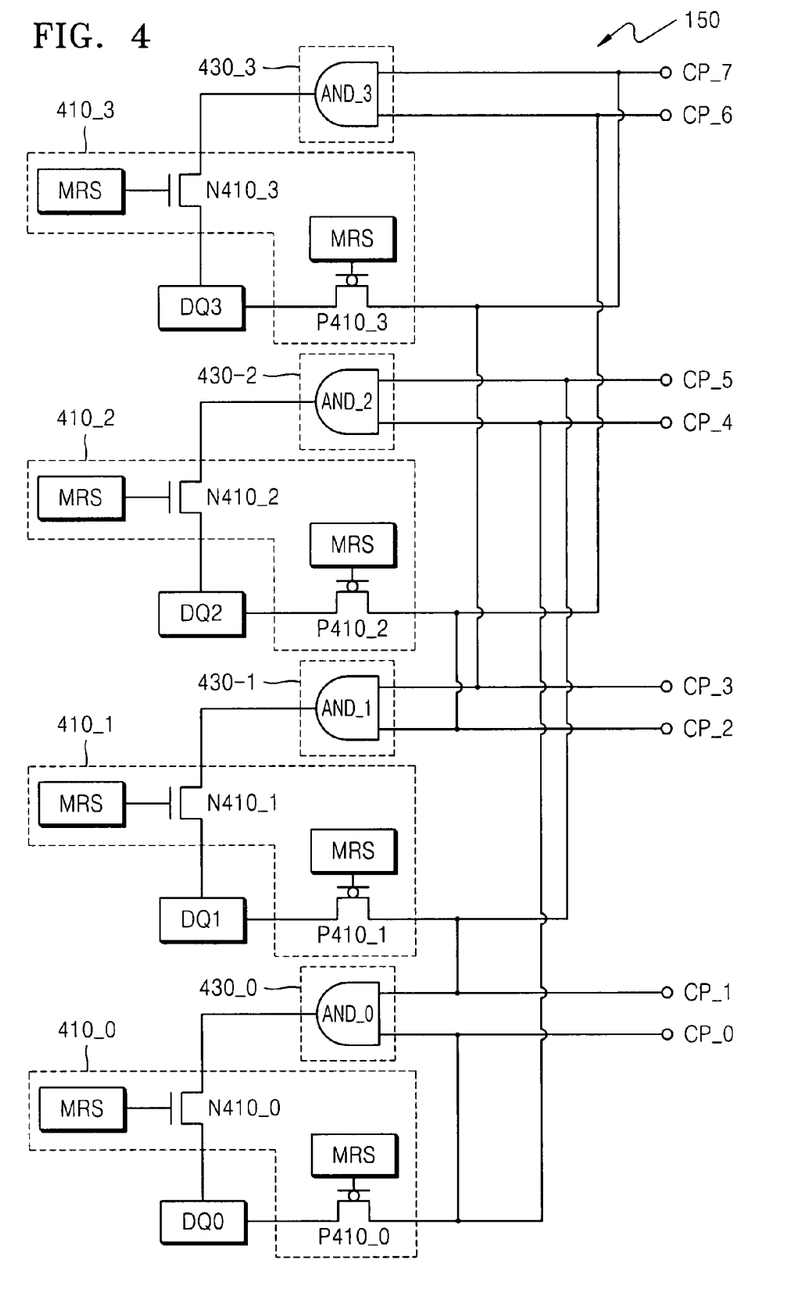
FIG. 4 is a circuit diagram illustrating a structure of a test circuit of the semiconductor memory device of FIG. 1 according to an example embodiment of the present invention.

FIG. 4 is a circuit diagram illustrating a structure of the test circuit 150 of the semiconductor memory device 100 of FIG. 1 according to an example embodiment of the present invention.

In the example embodiment of FIG. 4, the test circuit 150 may include a plurality of logic gates 430_0, through 430_N and a plurality of selecting units 410_0 through 410_N. In FIG. 4, the output signals CP_0, CP_1, CP_2, and CP_3 of four comparators 130_0, 130_1, 130_2, and 130_3 or output signals CP_0 through CP_7 of eight comparators 130_1 through 130_7 may be tested. However, it will be appreciated that other example embodiments of the present invention may include more or fewer logic gates and/or selecting units based on a configuration of the semiconductor memory device 100 (e.g., if the data lengths units are adjusted from 4 bits to 2 bits, 8 bits, etc.).

In the example embodiment of FIG. 4, the logic gates 430_0, 430_1, 430_2, and 430_3 may perform logical operations on the output signals (e.g., comparison result signals) CP_0 through CP_7 of the comparators. In an example, a logic gate of the logic gates 430_0 through 430_3 may be a logical product circuit (e.g., an AND gate).

In the example embodiment of FIG. 4, the selecting units 410_0, 410_1, 410_2 and 410_3 may select an output signal on the data input/output pads DQ0, DQ1, DQ2, and DQ3 based on a logic state of the select signal MRS. In an example, the selecting units 410_0, 410_1, 410_2 and 410_3 may select the output signals of the logic gates 430_0, 430_1, 430_2 and 430_3 and may output the selected signals to the data input/output pads DQ0, DQ1, DQ2, and DQ3 if the select signal MRS is in the first logic state. If the select signal MRS is in the second logic state, the selecting units 410_0, 410_1, 410_2 and 410_3 may select the output signals CP_0, CP_1, CP_2 and CP_3 of the comparators and may output the selected signals to the data input/output pads DQ0, DQ1, DQ2, and DQ3.

In the example embodiment of FIG. 4, the selecting unit 410_0 may include an NMOS transistor N410_0 and a PMOS transistor P410_0. The NMOS transistor N410_0 may include a gate connected to the select signal MRS, a first terminal connected to the output of the logic gate 430_0, and a second terminal connected to the data input/output pad DQ0. The PMOS transistor P410_0 may include a gate connected to the select signal MRS, a first terminal connected to the output of the comparator 130_0, and a second terminal connected to the data input/output pad DQ0. However, it will be appreciated by one of ordinary skill in the art that the position of the NMOS transistor N410_0 and the PMOS transistor P410_0 may be adjusted based on which the logic state requirements of the select signal MRS in other example embodiments of the present invention. In an example, the selecting units 410_1 through 410_3 may be configured in the same manner as the selecting unit 410_0, and therefore a further description of their respective structures has been omitted for the sake of brevity.

In the example embodiment of FIG. 4, the select signal MRS may correspond to a mode register set (MRS) signal. However, it will be appreciated by one of ordinary skill in the art that other signals may be used in other example embodiments of the present invention (e.g., if either of the first and second logic states may be used for controlling)

Figure 5:
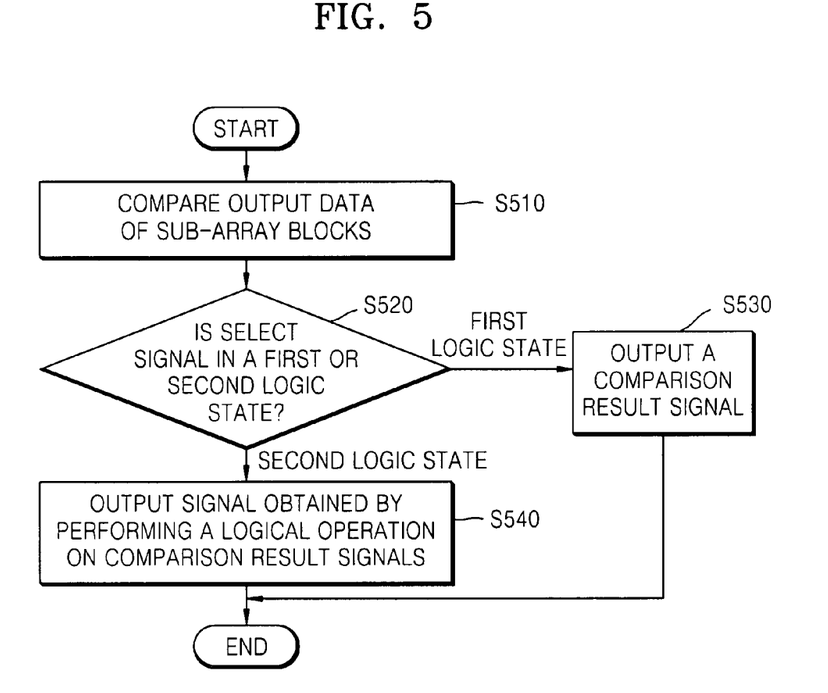
FIG. 5 is a flowchart illustrating a parallel bit test (PBT) process according to an example embodiment of the present invention.

FIG. 5 is a flowchart illustrating a PBT process according to an example embodiment of the present invention. In an example, the PBT process may be performed by the semiconductor memory device 100 including the test circuit 150 as described above with respect to FIGS. 1 and 4. Accordingly, for example purposes only, the PBT process of FIG. 5 will now be described with reference to FIGS. 1 through 4.

In the example embodiment of FIG. 5, for example purposes only, it may be assumed that each of the sub-array blocks 115_0 through 115_n in the semiconductor memory device 100 may output 4-bit data signals and the comparators 130_0 through 130_n may be configured as having the same structure as described above with respect to the example embodiment of FIG. 2A.

In the example embodiment of FIG. 5, the comparators 130_0 through 130_n may receive 4-bit output data signals D00, through D3n of the sub-array blocks 115_0 through 115_n and may compare the received signals (at S510). As described above with reference to FIG. 2A, an output signal of the comparators 130_0 through 130_n may be set to the first logic state if one or more defective cells is determined to be present and may otherwise be set to the second logic state if no defective cells are determined to be present. Accordingly, the logic state of the select signal MRS may be determined (at S520).

In the example embodiment of FIG. 5, if the logic state of the select signal MRS is determined to be in the first logic state (at S520), the NMOS transistors N410_0, N410_1, N410_2, and N410_3 may be turned off and the PMOS transistors P410_0, P410_1, P410_2, and P410_3 may be turned on (at S530). Accordingly, the output signals CP_0, CP_1, CP_2, and CP_3 of the comparators 130_0, 130_1, 130_2, and 130_3 may be output to the data input/output pads DQ0, DQ1, DQ2, and DQ3. If the select signal MRS is the first logic state, the test circuit 150 of FIG. 4 may test the output signals CP_0, CP_1, CP_2, and CP_3 of the four comparators 130_0, 130_1, 130_2, and 130_3 concurrently (at S530). Accordingly, the logic states of the output signals on the data input/output pads DQ0, DQ1, DQ2, and DQ3 may be used to determine whether one or more of the cells are defective. For example, if the output signal on the data input/output pad DQ0 is in the first logic state, the sub-array block 115_0 may be determined to be defective.

In the example embodiment of FIG. 5, if the logic state of the select signal MRS is determined to be in the second logic state (at S520), the NMOS transistors N410_0, N410_1, N410_2, and N410_3 may be turned on and the PMOS transistors P410_0, P410_1, P410_2, and P410_3 may be turned off (at S540). Accordingly, the output signals of the logic gates AND_0, AND_1, AND_2, and AND_3 may be output to the data input/output pads DQ0, DQ1, DQ2, and DQ3. If the select signal MRS is in the second logic state, the test circuit 150 of FIG. 4 may test the output signals CP_0 through CP_7 of the eight comparators 130_0 through 130_7 concurrently. As shown in the example embodiment of FIG. 4, in an example, the output signals of the comparators 130_0 through 130_7 may be tested in units of two output signals. However, it will be appreciated by one of ordinary skill in the art that an increase in the number of signals input to the logic gates AND_0 through AND_3 may likewise increase the number of sub-array blocks to be tested concurrently.

In the example embodiment of FIG. 5, in an example, the output signals of the comparators 130_0 through 130_7 may be tested in units of two output signals. The logic gate AND_0 may receive the output signals CP_0 and CP_1 of the comparators 130_0 and 130_1, may perform a logical product (AND) operation on the output signals CP_0 and CP_1 of the comparators 130_0 and 130_1, and may output a resulting signal to the data input/output pad DQ0. Similarly, the other logic gates AND_1, AND_2 and AND_3 may perform logical product operations on the output signals CP_2 through CP_7 of the comparators 130_2 through 130_7 in units of two output signals and may output the resulting signal to the other data input/output pads DQ1, DQ2, and DQ3. A determination may be made as to whether one or more of the cells is defective based on logic states of the output signals on the data input/output pads DQ0, DQ1, DQ2, and DQ3. For example, if the output signal on the data input/output pad DQ0 is in the first logic state, the two sub-array blocks 115_0 and 115_1 may be determined to be defective. In this manner, if the select signal MRS is in the second logic state, twice the number of sub-array blocks may be tested concurrently (e.g., simultaneously), as compared to the case where the select signal MRS is in the first logic state.

Figure 6:
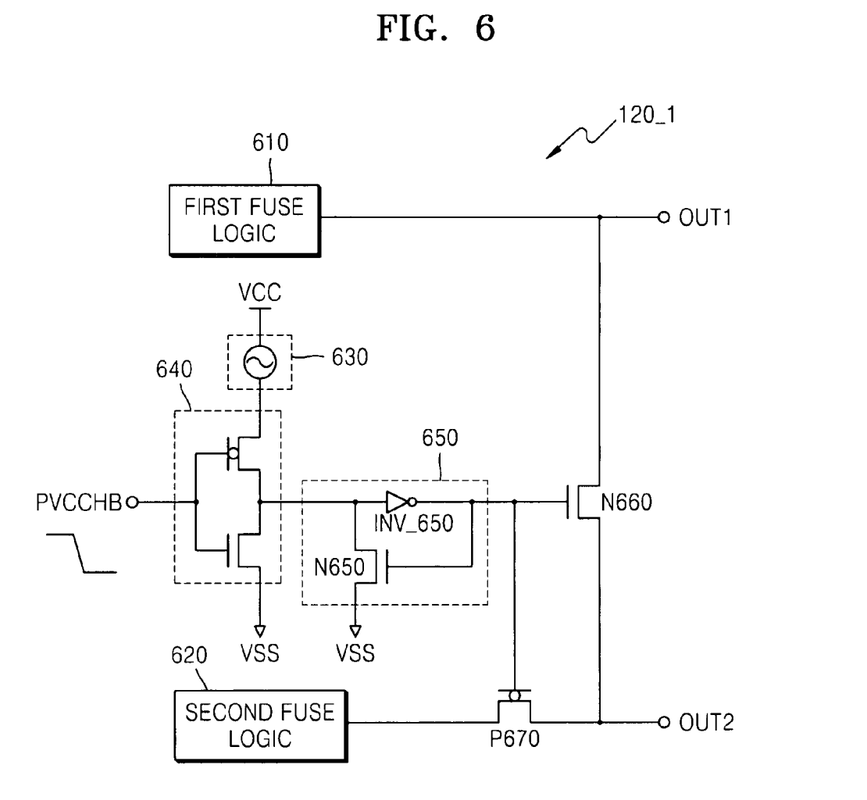
FIG. 6 is a circuit diagram illustrating an address share portion of the semiconductor memory device of FIG. 1 according to an example embodiment of the present invention.

FIG. 6 is a circuit diagram illustrating the address share portion 120_1 of the semiconductor memory device 100 of FIG. 1 according to an example embodiment of the present invention. In the example embodiment of FIG. 6, the address share portion 120_1 may include a master fuse 630, an inverter 640, a latch 650, and NMOS and PMOS transistors N660 and P670.

Example operation of the address share portion 120_1 will now be described with reference to FIGS. 1, 4 and 6. The address share portion 120_1

In example operation of the share portion 120_1 of FIG. 6, with reference to FIGS. 1 and 4, an example will now be described where the select signal MRS is set to the first logic state and the output signals on the data input/output pads DQ0 and DQ2 is set the first logic state. In this example, the sub-array blocks 115_0 and 115_2 may be determined to be defective as described above. Accordingly, the sub-array blocks 115_0 and 115_2 may be repaired with the redundancy cell blocks RED_0 and RED_1. A first fuse logic 610 may hold address information of the sub-array block 115_0 and a second fuse logic 620 may hold address information of the sub-array block 115_2. Because each of the sub-array blocks 115_0 and 115_2 may be repaired, the master fuse 630 need not be cut. An input signal PVCCHB may initially be set to the second logic state, and may be transitioned to the first logic state. Because the master fuse 630 need not be cut, an output of the inverter 640 may transition to the second logic state and the output of the latch 650 may transition to the first logic state. Accordingly, the NMOS transistor N660 may be turned off and the PMOS transistor P670 may be turned on. The address information held in the first fuse logic 610 may be transferred to the redundancy cell block RED_0 via the output OUT1, and the address information held in the second fuse logic 620 may be transferred to the redundancy cell block RED_1 via the output OUT2. Accordingly, the address information of the sub-array block 115_0 may be transferred to the redundancy cell block RED_0 and the address information of the sub-array block 115_2 may be transferred to the redundancy cell block RED_1.

In example operation of the share portion 120_1 of FIG. 6, with reference to FIGS. 1 and 4, an example will now be described where the select signal MRS is set to the second logic state and the output signal on the data input/output pad DQ0 is set to the first logic state. In this example, the sub-array blocks 115_0 and 115_1 may be determined to be defective (e.g., for reasons discussed above in detail). Accordingly, the sub-array blocks 115_0 and 115_1 may be repaired with the redundancy cell blocks RED_0 and RED_1. The first fuse logic 610 may hold the address information of the sub-array block 115_0, and the second fuse logic 620 may hold the address information of the sub-array block 115_1. In an example, the address information held in the first fuse logic 610 may be shared between the redundancy cell blocks RED_0 and RED_1 to reduce the number of fuses cut in the redundancy cell blocks RED_0 and RED_1. Because the redundancy cell blocks RED_0 and RED_1 may share the address information, the master fuse 630 may be cut. Because the master fuse 630 may be cut, the output of inverter 640 may transition to the first logic state (e.g., a lower logic level or logic "0") (e.g., an "initial state"). Because the latch 650 latches the output of the inverter 640, the output of the latch 650 may be maintained in the second logic state (e.g., a higher logic level or logic "1"). Accordingly, the NMOS transistor N660 may be turned on and the PMOS transistor P670 may be turned off. The address information held in the first fuse logic 610 may be transferred to the redundancy cell blocks RED_0 and RED_1 via the output terminals OUT1 and OUT2, and the address information held in the second fuse logic 620 may not be output via the output terminal OUT2. Accordingly, the address information of the cell array block 115_0 may be transferred to the redundancy cell blocks RED_0 through RED_N and the address information of the cell array block 115_2 may be not transferred.

In another example embodiment of the present invention, the redundancy cell blocks RED_0 through RED_N may share address information by cutting only the master fuse 630, such that fewer fuses may be cut to replace a given defective cell or cells.

Returning to the example embodiment of FIG. 5, the address share portion 120_1 may include the master fuse 630, the inverter 640, the latch 650, and the transistors N660 and P670. It will be appreciated that, in another example embodiment of the present invention, the information held in either the first fuse logic 610 or the second fuse logic 620 may be output to the output terminals OUT1 and OUT2.

A PBT process and semiconductor memory device executing the PBT process configured in accordance with example embodiments of the present invention may reduce test time and cost and may increase test efficiency. Further, if a defective sub-array block is detected and repaired, the number of fuses in the redundancy cell block that need be cut may be reduced.

Example embodiments of the present invention being thus described, it will be obvious that the same may be varied in many ways. For example, it is understood that the above-described first and second logic states may correspond to a lower level and a higher logic level, respectively, in an example embodiment of the present invention. Alternatively, the first and second logic levels/states may correspond to the higher logic level and the lower logic level, respectively, in other example embodiments of the present invention.

Such variations are not to be regarded as a departure from the spirit and scope of example embodiments of the present invention, and all such modifications as would be obvious to one skilled in the art are intended to be included within the scope of the following claims.

What is claimed is:

1. A semiconductor memory device comprising:
   a plurality of comparators receiving output data signals from each of a plurality of sub-array blocks, comparing the output data signals from each of the plurality of sub-array blocks and outputting a plurality of comparison result signals; and
   a test circuit receiving the plurality of comparison result signals from the plurality of comparators, respectively, the test circuit configured to selectively output one of a given one of the plurality of comparison result signals on a given data input/output pad and a given signal obtained by performing a logical operation on at least two of the plurality of comparison result signals on the given data input/output pad in response to a select signal.

2. The semiconductor memory device of claim 1, wherein the test circuit includes:
   at least one logic gate performing the logical operation on the plurality of comparison result signals from the plurality of comparators; and
   at least one selecting unit selectively outputting the given one comparison result signal if the select signal is in a first logic state, the at least one selecting unit selectively outputting an output signal of the at least one logic gate as the given signal if the select signal is in a second logic state.

3. The semiconductor memory device of claim 1, wherein the select signal is a mode register set (MRS) signal.

4. The semiconductor memory device of claim 1, wherein the logical operation used to obtain the given signal is performed based on comparison result signals from a pair of the plurality of comparators.

5. The semiconductor memory device of claim 1, wherein at least one of the plurality of comparators outputs a corresponding comparison result signal in a first logic state if output data signals from the sub-array blocks are each set to the same logic state and the at least one of the plurality of comparators outputs the corresponding comparison result signal in a second logic state if at least one of the output data signals from the sub-array blocks is in a different logic state as compared to at least one other of the output data signals from the sub-array blocks.

6. The semiconductor memory device of claim 1, further comprising:
   a memory cell array including the plurality of sub-array blocks and a plurality of redundancy cell blocks.

7. The semiconductor memory device of claim 2, wherein the logic gate includes a logical product circuit including an AND gate.

8. The semiconductor memory device of claim 2, wherein the selecting unit includes:
   a first transistor having a gate connected to the select signal, a first terminal connected to the output of the at least one logic gate, and a second terminal connected to the given data input/output pad; and
   a second transistor having a gate connected to the select signal, a first terminal connected to the output of at least one of the plurality of comparators, and a second terminal connected to the given data input/output pad.

9. The semiconductor memory device of claim 8, wherein the first transistor is an NMOS transistor and the second transistor is a PMOS transistor.

10. The semiconductor memory device of claim 6, wherein the memory cell array further includes:
    an address share portion enabling at least one of the plurality of redundancy cell blocks to repair sub-array blocks corresponding to the given signal in order to share address information of the sub-array blocks.

11. The semiconductor memory device of claim 10, wherein the address share portion determines an address of one of the plurality of redundancy cell blocks and enables other of the plurality of redundancy cell blocks to share the determined address information, if the given signal indicates that at least one of the sub-array blocks is defective.

12. The semiconductor memory device of claim 10, wherein the address share portion includes:
    a master fuse configured to be cut if the given signal indicates that at least one of the sub-array blocks is defective; and
    a transfer unit transferring the address information to the redundancy cell blocks if the master fuse is cut.

13. The semiconductor memory device of claim 12, wherein the address share portion enables the redundancy cell blocks to share the address information if the master fuse is cut and the address share portion instructs the redundancy cell blocks to not share the address information if the master fuse is not cut.

14. A method of performing a parallel bit test with a semiconductor memory device, comprising:
    receiving a plurality of output data signals from a plurality of sub-array blocks, respectively;
    comparing the output data signals from each of the plurality of sub-array blocks to generate a plurality of comparison result signals; and
    selectively outputting one of a given one of the plurality of comparison result signals on a given data input/output pad and a given signal on the given data input/output pad in response to a select signal, the given signal generated by performing a logical operation on at least two of the plurality of comparison result signals.

15. The method of claim 14, wherein the selectively outputting step includes:
    outputting the given one comparison result signal to the given data input/output pad if the select signal is in a first logic state; and
    outputting the given signal to the given data input/output pad if the select signal is in a second logic state.

16. The method of claim 14, wherein the select signal is a mode register set (MRS) signal.

17. The method of claim 14, wherein the logical operation used to obtain the given signal includes a logical product operation performed on a pair of the plurality of comparison result signals.

18. The method of claim 14, wherein the comparing step includes:
    outputting a given comparison result signal in a first logic state if each of a set of compared output data signals received from the sub-array blocks are set to the same logic state; and
    outputting the given comparison result signal in a second logic state if at least one of the set of compared output data signals from the sub-array blocks is in a different logic state as compared to at least one other from among the set of compared output data signals.

19. The method of claim 14, further comprising:
determining an address of at least one redundancy cell block if the given signal indicates that at least one cell is defective; and
sharing the determined address information with at least one other redundancy cell block.

20. The method of claim 19, wherein sharing the determined address information further includes cutting a master fuse.

21. The method of claim 14, wherein the logical operation used to obtain the given signal includes a logical product operation performed on the plurality of comparison result signals.

* * * * *